United States Patent [19]
Higashiguchi

[11] Patent Number: 6,144,090
[45] Date of Patent: Nov. 7, 2000

[54] BALL GRID ARRAY PACKAGE HAVING ELECTRODES ON PERIPHERAL SIDE SURFACES OF A PACKAGE BOARD

[75] Inventor: Yutaka Higashiguchi, Kawasaki, Japan

[73] Assignee: Fujitsu Limited, Kawasaki, Japan

[21] Appl. No.: 08/924,827

[22] Filed: Sep. 5, 1997

[30] Foreign Application Priority Data

Feb. 13, 1997 [JP] Japan ..................................... 9-029458

[51] Int. Cl.⁷ .................................................. H01L 23/48
[52] U.S. Cl. .......................... 257/693; 257/690; 257/692; 257/698; 257/775
[58] Field of Search ................................... 257/690, 697, 257/698, 775, 692, 693

[56] References Cited

U.S. PATENT DOCUMENTS

| | | | |
|---|---|---|---|
| 5,248,347 | 9/1993 | Ochi ......................................... | 136/256 |
| 5,293,067 | 3/1994 | Thompson et al. ...................... | 257/668 |
| 5,388,029 | 2/1995 | Moriyama ................................ | 361/760 |
| 5,468,999 | 11/1995 | Lin et al. ................................. | 257/784 |
| 5,541,450 | 7/1996 | Jones et al. ............................. | 257/697 |
| 5,689,091 | 11/1997 | Hamzehdoost et al. ................. | 174/255 |

FOREIGN PATENT DOCUMENTS

| | | |
|---|---|---|
| 60-148151 | 8/1985 | Japan . |
| 1-217931 | 8/1989 | Japan . |
| 7-38217 | 2/1995 | Japan . |
| 7-153903 | 6/1995 | Japan . |

OTHER PUBLICATIONS

Technology Disclosure Report No. 84–013671, vol. 9–50, Nov. 20, 1984.

*Primary Examiner*—David Hardy
*Assistant Examiner*—George C. Eckert, II
*Attorney, Agent, or Firm*—Armstrong, Westerman, Hattori, McLeland & Naughton

[57] ABSTRACT

A ball grid array package includes a package board having a bottom surface, a top surface, and peripheral side surfaces, the bottom surface having solder ball pads provided thereon, the top surface having wire bonding pads provided thereon. A semiconductor chip is contained on the package board and electrically connected to the wire bonding pads. Solder balls are arrayed in a grid formation on the bottom surface of the package board and respectively soldered to the solder ball pads of the package board. Electrodes are provided on the peripheral side surfaces of the package board, each electrode having a first portion provided on one of the peripheral side surfaces, a second portion provided on the top surface and a third portion provided on the bottom surface. Wiring patterns are provided between the bottom surface and the top surface of the package board, electrically connecting the wire bonding pads with the second portions of the electrodes, and electrically connecting the solder ball pads with the third portions of the electrodes. The semiconductor chip is electrically connected to the solder ball pads through the electrodes and the wiring patterns.

12 Claims, 16 Drawing Sheets

BALL GRID ARRAY PACKAGE HAVING ELECTRODES ON PERIPHERAL SIDE SURFACES OF A PACKAGE BOARD

BACKGROUND OF THE INVENTION (1) Field of the Invention

The present invention relates to a ball grid array package which is contained on a mother-board of a portable electronic device.

(2) Description of the Related Art

Portable electronic devices use semiconductor chip packages which are contained on a motherboard. There are various types of packages, such as pin-grid-array packages, gull-wing lead packages and ball-grid-array packages. Recently, there is an increasing demand to make the portable electronic devices as small as possible in size. In conformity with the demand, it is needed to increase the package density and make the motherboard smaller in size.

The ball-grid-array packages are useful and advantageous to increase the package density and make the motherboard size smaller.

FIGS. 1A, 1B and 1C show a conventional ball-grid-array (BGA) package 10. FIG. 1A is a side view of the conventional BGA package 10. FIG. 1B is a perspective view of the bottom of the conventional BGA package 10. FIG. 1C is an enlarged side view of a portion 11 of the conventional BGA package 10.

As shown in FIGS. 1A and 1B, the conventional BGA package 10 comprises a package board 12, a semiconductor chip 13 contained on the package board 12, a resin material 14 encapsulating the semiconductor chip 13, and a plurality of solder balls 15 arrayed in a grid formation on the bottom of the package board 12.

As shown in FIG. 1C, the package board 12 has a bottom surface, a top surface and an internal portion between the bottom surface and the top surface. Solder ball pads 16 are formed on the bottom surface of the package board 12, and wire bonding pads 17 are formed on the top surface thereof. In the internal portion of the package board 12, wiring patterns 18 and vias 19 are formed. The solder ball pads 16 and the wire bonding pads 17 are electrically connected by the wiring patterns 18 and the vias 19.

As shown in FIG. 1C, a wire 20 is bonded at one end to the semiconductor chip 13 and at the other end to one of the wire bonding pads 17 on the top of the package board 12. The solder balls 15 are soldered to the solder ball pads 16 on the bottom of the package board 12, and secured to the BGA package 10. The periphery of each of the solder ball pads 16 is encircled by a solder resist 22.

As shown in FIGS. 1A and 1C, the solder balls 15 are soldered to pads 26 of a motherboard 25 (indicated by two-dot chain lines in FIGS. 1A and 1C) so that the conventional BGA package 10 is housed in the motherboard 25. The soldering of the solder balls 15 and the pads 26 is carried out by passing the motherboard 25 with the conventional BGA package 10 temporarily bonded thereto through a reflow soldering furnace.

As indicated by two-dot chain lines in FIG. 1C, a wiring pattern 27 extends from one of the pads 26 on the motherboard 25, and a chip element pad 28 is formed on the motherboard 25 at one end of the wiring pattern 27. A semiconductor chip element 29 is soldered to the chip element pad 28. A combination of the motherboard 25, the conventional BGA package 10 and the semiconductor chip element 29 contained on the motherboard 25 is called a multichip module 30. The multichip module 30 is incorporated in a portable electronic device.

In the multichip module 30, the locations at which the solder balls 15 on the bottom of the BGA package 10 are actually soldered to the pads 26 on the top of the motherboard 25 are concealed by the BGA package 10. For this reason, the multichip module 30 has the following problems:

(1) A defective soldering of the solder balls 15 and the pads 26 cannot be easily repaired by using a soldering iron. If a defective soldering of the solder balls 15 and the pads 26 is found, an effective repairing measure is not taken and the multichip module 30 has to be a defective part.

(2) It is difficult to perform a modification of the electrical characteristics of the multichip module 30 (or the BGA package 10) by soldering of a jumper wire or a circuit element. There is no space in the multichip module 30 (or the BGA package 10) adequate for the soldering of the jumper wire or the circuit element.

(3) It is difficult to perform a testing of the condition of the soldered connections between the solder balls 15 and the pads 26. There is no space in the multichip module 30 (or the BGA package 10) adequate for contacting a probe of a tester. Therefore, it is difficult to assure the reliability of the soldered connections between the solder balls 15 and the pads 26 in the multichip module 30.

SUMMARY OF THE INVENTION

An object of the present invention is to provide an improved ball grid array package in which the above-mentioned problems are eliminated.

Another object of the present invention is to provide a ball grid array package which enables a repair of a defective soldered connection between the ball grid array package and a motherboard to be easily performed.

Still another object of the present invention is to provide a ball grid array package which enables a testing of the condition of soldered connections between the ball grid array package and a motherboard to be easily performed.

A further object of the present invention is to provide a ball grid array package which enables a modification of the electrical characteristics of the ball grid array package to be easily performed.

The above-mentioned objects of the present invention are achieved by a ball grid array package which comprises: a package board having a bottom surface, a top surface, and peripheral side surfaces, the bottom surface having solder ball pads provided thereon, the top surface having wire bonding pads provided thereon; a semiconductor chip contained on the package board, the semiconductor chip being electrically connected to the wire bonding pads of the package board; solder balls arrayed in a grid formation on the bottom surface of the package board, the solder balls being respectively soldered to the solder ball pads of the package board; electrodes provided on the peripheral side surfaces of the package board, each electrode having a first portion provided on one of the peripheral side surfaces, a second portion provided on the top surface and a third portion provided on the bottom surface; and wiring patterns provided between the bottom surface and the top surface of the package board, the wiring patterns electrically connecting the wire bonding pads with the second portions of the electrodes and electrically connecting the solder ball pads with the third portions of the electrodes, wherein the semiconductor chip is electrically connected to the solder ball pads through the electrodes and the wiring patterns.

The ball grid array package of the present invention comprises the electrodes which are provided on the peripheral side surfaces of the package board, and the wiring patterns which electrically connect the wire bonding pads with the electrodes and electrically connect the solder ball pads with the electrodes. The semiconductor chip is electrically connected to the solder ball pads through the electrodes and the wiring patterns. According to the present invention, it is possible to easily perform a repair of a defective soldered connection between the ball grid array package and the motherboard. It is possible to easily perform a testing of the condition of soldered connections between the ball grid array package and the motherboard. Further, according to the present invention, it is possible to easily perform a modification of the electrical characteristics of the ball grid array package.

BRIEF DESCRIPTION OF THE DRAWINGS

The above and other objects, features and advantages of the present invention will become more apparent from the following detailed description when read in conjunction with the accompanying drawings in which.

DESCRIPTION OF THE PREFERRED EMBODIMENTS

A description will now be given of the preferred embodiments of the present invention with reference to the accompanying drawings.

Figure 2A:
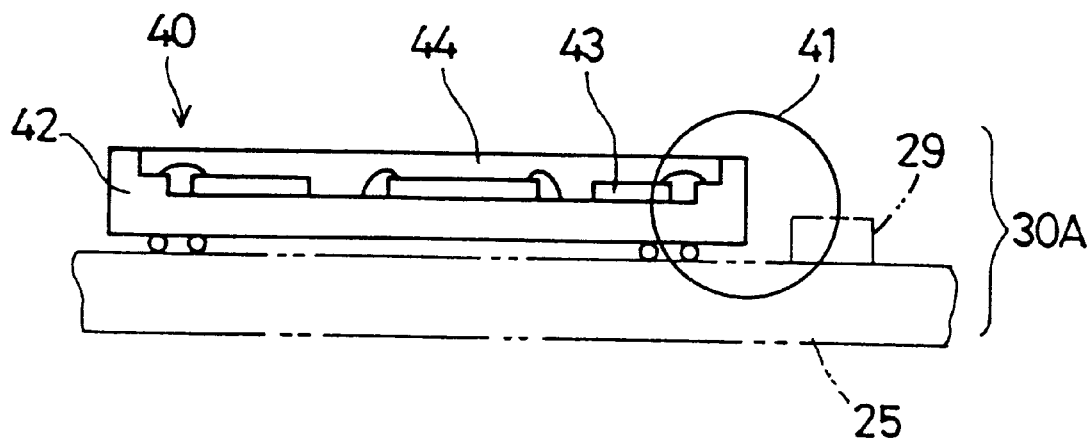
FIGS. 2A and 2B are diagrams of a first embodiment of a ball grid array package of the present invention.
Figure 2B:
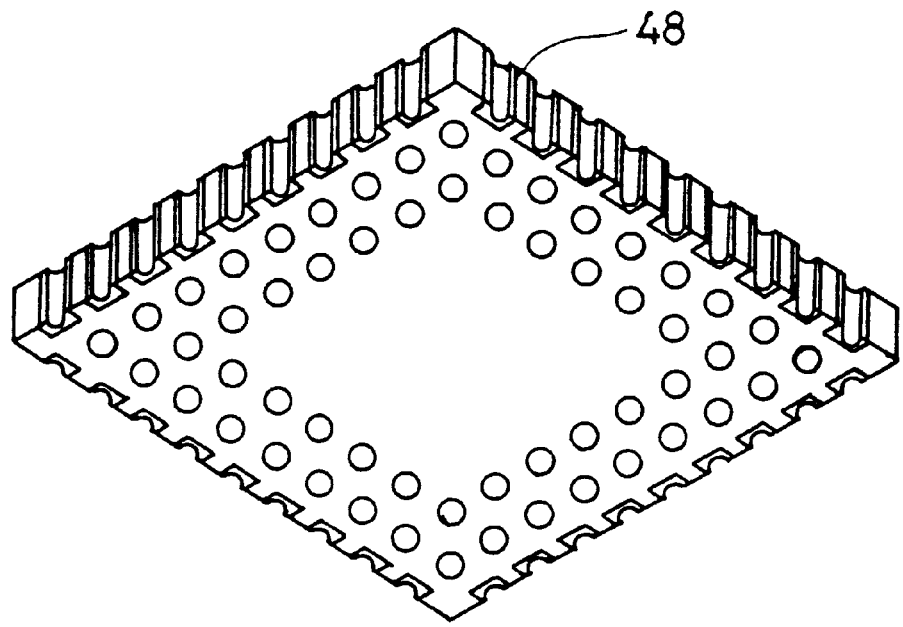

FIGS. 2A and 2B show a first embodiment of the ball grid array (BGA) package of the present invention. FIG. 2A is a side view of a ball grid array (BGA) package 40, and FIG. 2B is a perspective view of the bottom of the ball grid array package 40.

Figure 3A:
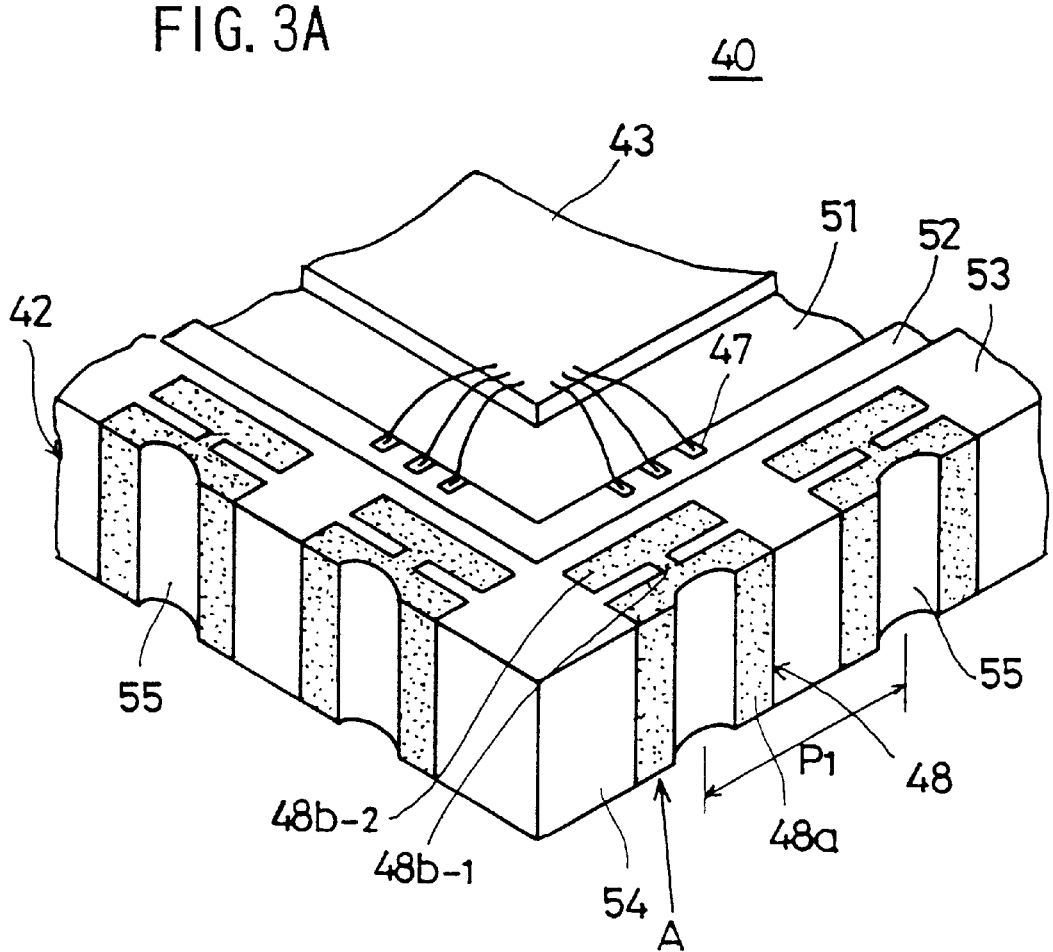
FIGS. 3A and 3B are diagrams showing a portion of the ball grid array package of FIG. 2A.
Figure 3B:
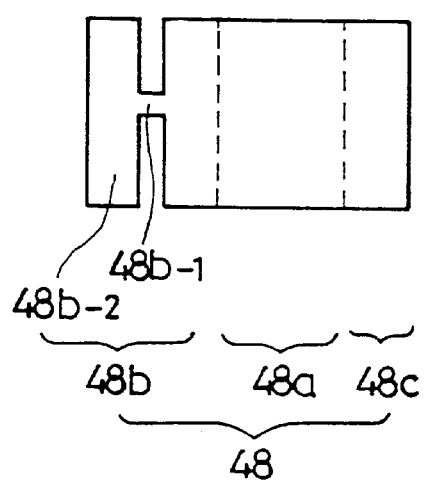
Figure 4:
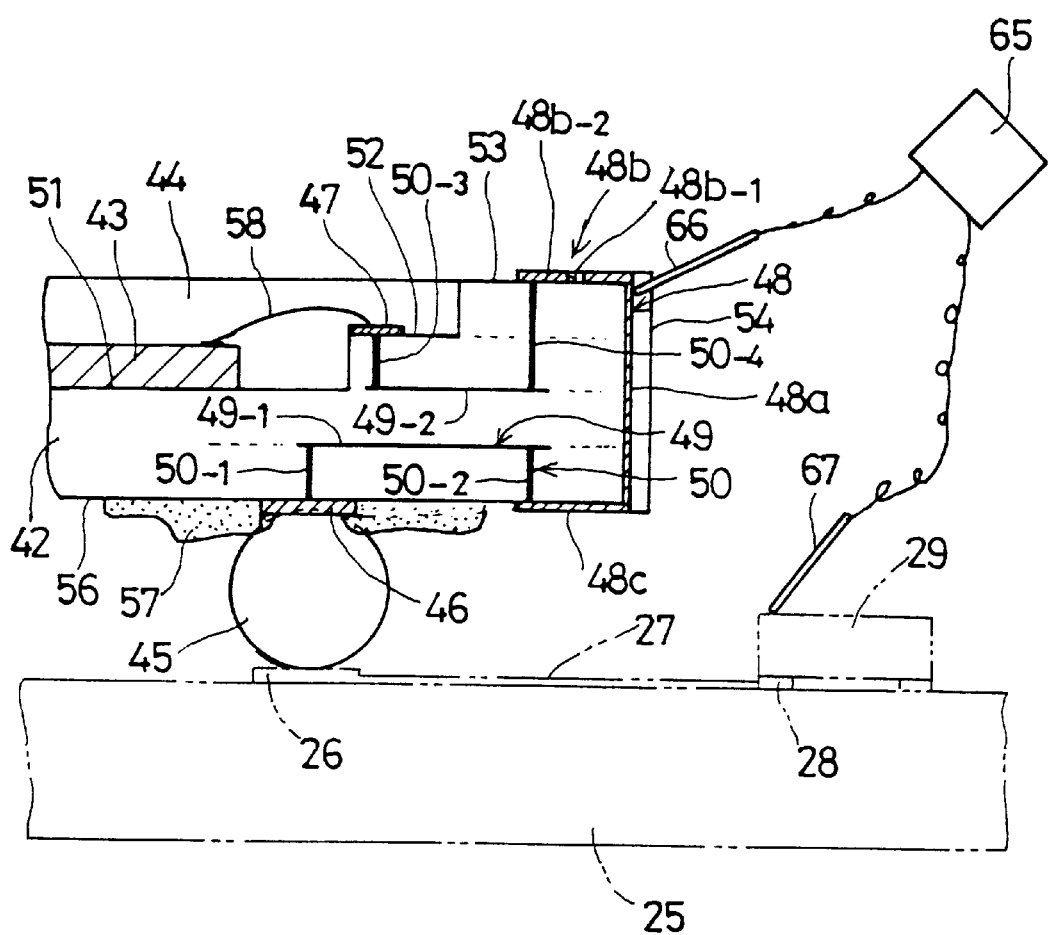
FIG. 4 is an enlarged diagram of the portion of the ball grid array package of FIG. 2A.

FIG. 3A shows the details of a corner portion 41 of the ball grid array package 40, and FIG. 3B shows the details of a half through hole electrode 48 of the ball grid array package 40, which is indicated by the arrow "A" in FIG. 3A. FIG. 4 is an enlarged diagram for explaining the corner portion 41 of the ball grid array package 40.

Figure 1A:
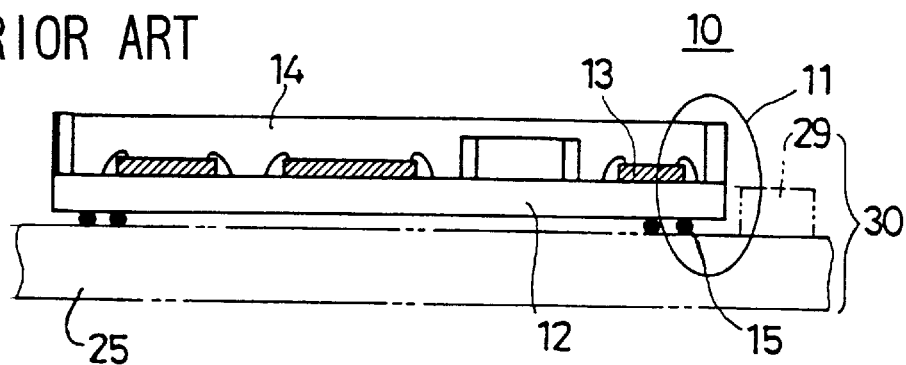
FIGS. 1A, 1B and 1C are diagrams of a conventional ball grid array package.
Figure 1B:
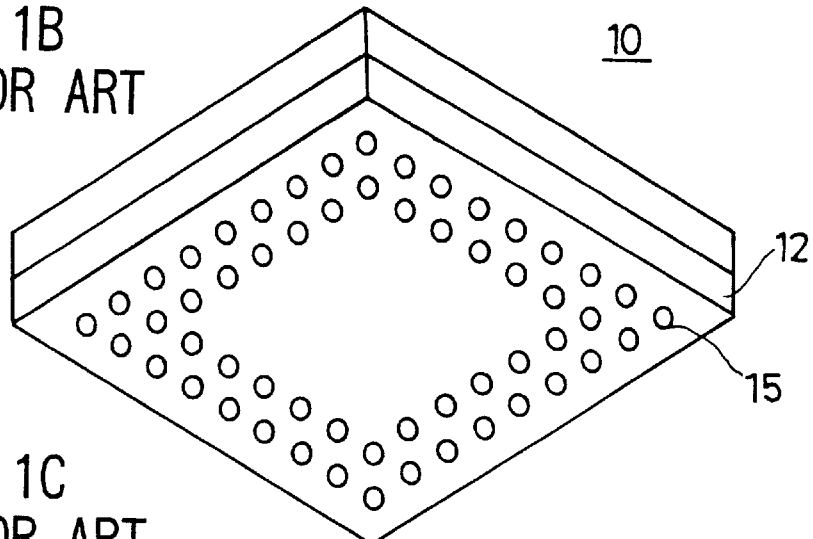
Figure 1C:
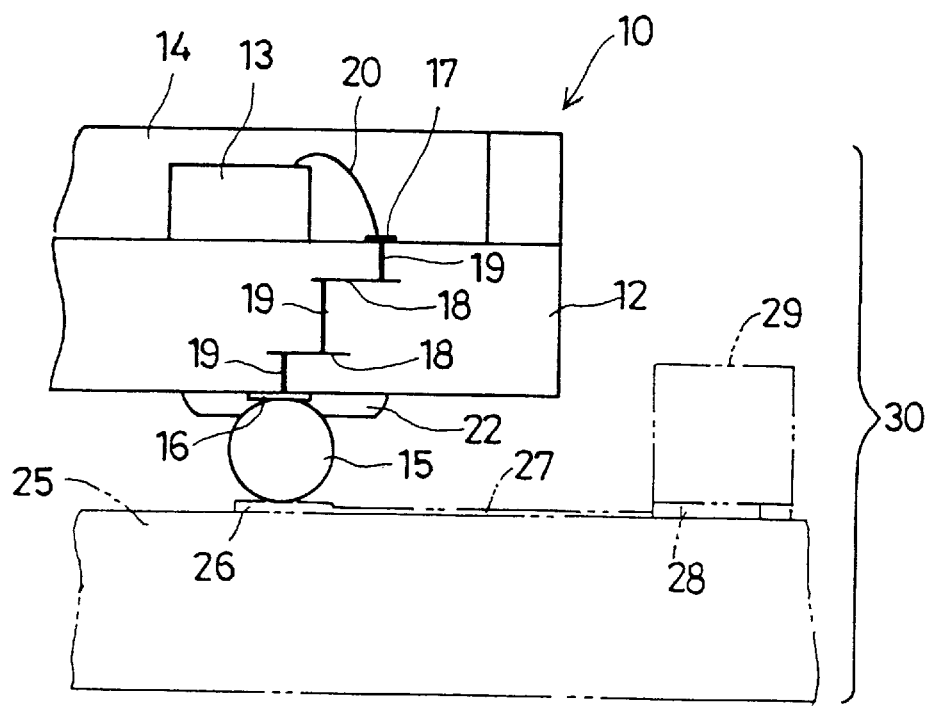

In FIGS. 2A through 4, the elements which are the same as corresponding elements in FIGS. 1A through 1C are designated by the same reference numerals, and a description thereof will be omitted.

As shown in FIGS. 2A through 4, the BGA package 40 comprises a package board 42, a semiconductor chip 43 contained on the package board 42, a resin material 44 encapsulating the semiconductor chip 43, and a plurality of solder balls 45 arrayed in a grid formation on the bottom of the package board 42.

The package board 42 is made of a BT resin material. The package board 42 is formed in a rectangular shape. As shown in FIG. 4, the package board 42 has a bottom surface 56, a top surface, peripheral side surfaces 54, and an internal portion between the bottom surface and the top surface. Solder ball pads 46 are formed on the bottom surface 56 of the package board 42, and wire bonding pads 47 are formed on the top surface of the package board 42. Half through hole electrodes 48 are formed on the peripheral side surfaces 54 of the package board 42. In the internal portion of the package board 42, wiring patterns 49 and vias 50 are formed.

As shown in FIG. 4, the wiring patterns 49 include a wiring pattern 49-1, a wiring pattern 49-2 and others, and the vias 50 include a via 50-1, a via 50-2 and others. The periphery of each of the solder ball pads 46 is encircled by a solder resist 57.

As shown in FIG. 3A, the top surface of the package board 42 has a rectangular center portion 51 being at the lowest location, an elevated middle portion 52 encircling the center portion 51, and a peripheral portion 53 encircling the elevated middle portion 52 and being at the highest location. The peripheral portion 53 and the peripheral side surfaces 54 form the periphery of the BGA package 40.

The package board 42 is formed from a large package board sheet in which through holes are arranged in rows and columns. A plurality of package boards 42 are included in this package board sheet and each package board 42 is segmented by the rows and the columns of the through holes. The package board sheet is cut along the center lines of the rows and the columns of the through holes into the package boards 42, each of the package boards 42 having the peripheral side surfaces with half through holes being formed thereon. The package board 42 is thus formed.

As shown in FIGS. 2B and 3A, each of the peripheral side surfaces 54 of the package board 42 has half through holes 55 provided on the peripheral side surface 54, and the half through holes 55 are separated from each other by a small pitch "P1" along the peripheral side surface 54.

The wire bonding pads 47 on the top of the package board 42 are arranged on the elevated middle portion 52 of the package board 42. The solder ball pads 46 on the bottom of the package board 42 are soldered to the solder balls 45, and the solder balls 45 are secured to the package board 42.

As shown in FIGS. 3A, 3B and 4, each of the half through hole electrodes 48 has a first electrode portion 48a on the peripheral side surface 54, a second electrode portion 48b on the peripheral portion 53, and a third electrode portion 48c on the bottom surface 56. The first electrode portion 48a, the second electrode portion 48b and the third electrode portion 48c are integrally formed and electrically conductive to each other. The second electrode portion 48b has a restricted portion 48b-1 in the middle of the second electrode portion 48b and a wire bonding pad 48b-2 extending from the restricted portion 48b-1 to the leading edge of the second electrode portion 48b.

The restricted portion 48b-1 and the wire bonding pad 48b-2 of each of the half through hole electrodes 48 are provided for use in repairing a defective soldered connection with respect to the solder balls 45. The restricted portion 48b-1 is formed with a reduced thickness such that it can be easily cut off by subjecting it to a laser beam from a laser beam cutter. The wire bonding pad 48b-2 is arranged at the edge of each half through hole electrode 48 such that a soldered connection between a jumper wire and the wire bonding pad 48b-2 can be easily performed.

As shown in FIG. 4, one of the solder ball pads 46 and the third electrode portion 48c of one of the half through hole electrodes 48 are electrically connected to each other by the via 50-1, the wiring pattern 49-1 and the via 50-2. One of the wire bonding pads 47 and the second electrode portion 48b of one of the half through hole electrodes 48 are electrically connected to each other by the via 50-3, the wiring pattern 49-2 and the via 50-4.

Figure 5:
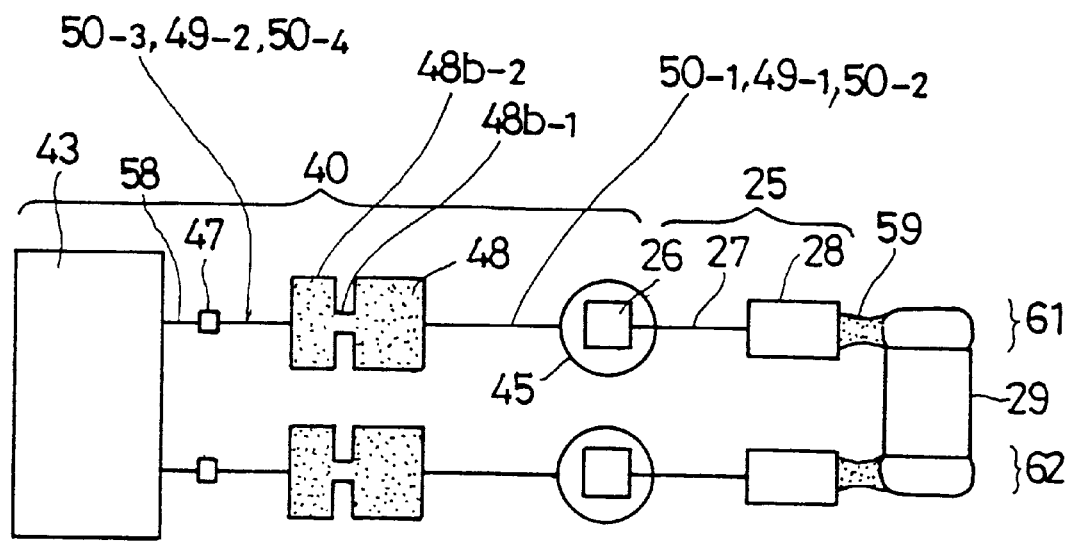
FIG. 5 is a diagram for explaining electrical connections between the ball grid array package and a motherboard.

FIG. 5 shows electrical connections between the BGA package 40 and the motherboard 25.

In the electrical connections between the BGA package 40 and the motherboard 25 shown in FIG. 5, the solder ball pad 46 and the wire bonding pad 47 are electrically connected to each other by the half through hole electrode 48, the wiring patterns 49 and the vias 50.

Further, as shown in FIG. 4, the semiconductor chip 43 is secured to the center portion 51 of the package board 42. Each of wires 58 is bonded at one end to the semiconductor chip 43 and bonded at the other end to one of the wire bonding pads 47. The resin material 44 encloses the semiconductor chip 43, the wires 58 and the wire bonding pads 47. The second electrode portion 48b of each half through hole electrode 48 is not enclosed by the resin material 44 and it is exposed on the top of the package board 42.

As shown in FIG. 2A, the solder balls 45 are soldered to the pads 26 of the motherboard 25 (indicated by two-dot chain lines in FIG. 2A) so that the BGA package 40 is housed in the motherboard 25. The soldering of the solder balls 45 and the pads 26 is carried out by passing the motherboard 25 with the BGA package 40 temporarily bonded thereto, through a reflow soldering furnace.

As indicated by two-dot chain lines in FIGS. 2A and 4, the wiring pattern 27 extends from one of the pads 26 on the motherboard 25, and the chip element pad 28 is formed on the motherboard 25 at one end of the wiring pattern 27. The semiconductor chip element 29 is soldered to the chip element pad 28. A combination of the motherboard 25, the BGA package 40 and the semiconductor chip element 29 contained on the motherboard 25 is called a multichip module 30A. The multichip module 30A is incorporated in a portable electronic device.

In the multichip module 30A, the semiconductor chip 43 and the semiconductor chip element 29 are electrically connected to each other, as shown in FIG. 5. In FIG. 5, only two routes 61 and 62 of the electrical connections between the BGA package 40 and the motherboard 25 are shown. In the multichip module 30A, the half through hole electrodes 48 of the BGA package 40 are exposed to the outside and located adjacent to the semiconductor chip element 29 of the motherboard 25.

The half through hole electrodes 48 of the ball grid array package 40 of the present embodiment provide the following novel and useful functions: (1) easy testing of the condition of the soldered connections between the solder balls 45 and the pads 26; (2) easy repair of a defective soldering of the solder balls 45 and the pads 26; and (3) easy modification of the electrical characteristics of the multichip module 30A (or the BGA package 40) by using a soldering of a jumper wire or a chip element.

Next, a description will be given of a testing of the condition of the soldered connections between the solder balls 45 and the pads 26 in the ball grid array package 40 of the present embodiment.

As shown in FIG. 4, a tester 65 has a first probe 66 and a second probe 67. According to the BGA package 40 of the present embodiment, a testing of the condition of the soldered connection between the solder ball 45 and the pad 26 is performed with the tester 65 by contacting the first probe 66 to the half through hole electrode 48 and contacting the second probe 67 to the chip element 29. When it is detected by using the tester 65 that the electrical connection between the half through hole electrode 48 and the chip element 29 is conductive, it is checked that the soldered connection between the solder ball 45 and the pad 26 is in a normal condition.

Therefore, by performing the above-described testing for all the soldered connections between the solder balls 45 and the pads 26 within the multichip module 30A, it is possible to assure the reliability of the soldered connections between the solder balls 45 and the pads 26 in the multichip module 30A.

Next, a description will be given of a repair of a defective soldering of the solder balls 45 and the pads 26 in the BGA package 40 of the present embodiment.

Figure 6A:
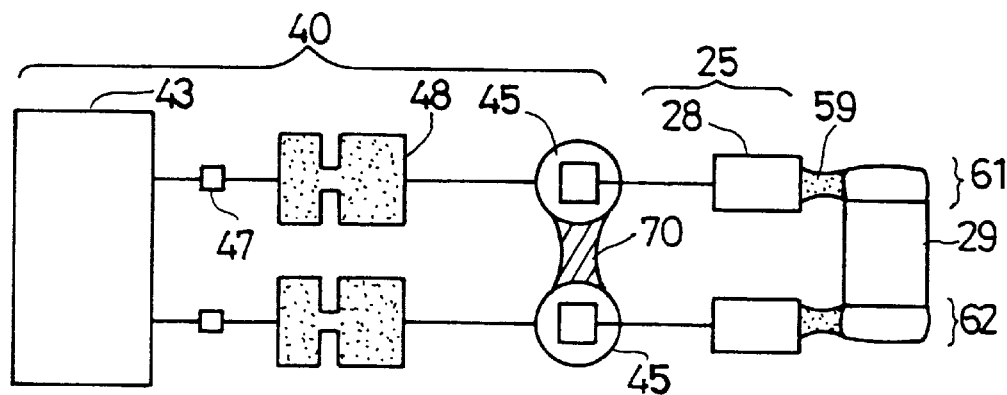
FIGS. 6A and 6B are diagrams for explaining a repair of a defective soldering of the ball grid array package and the motherboard.
Figure 6B:
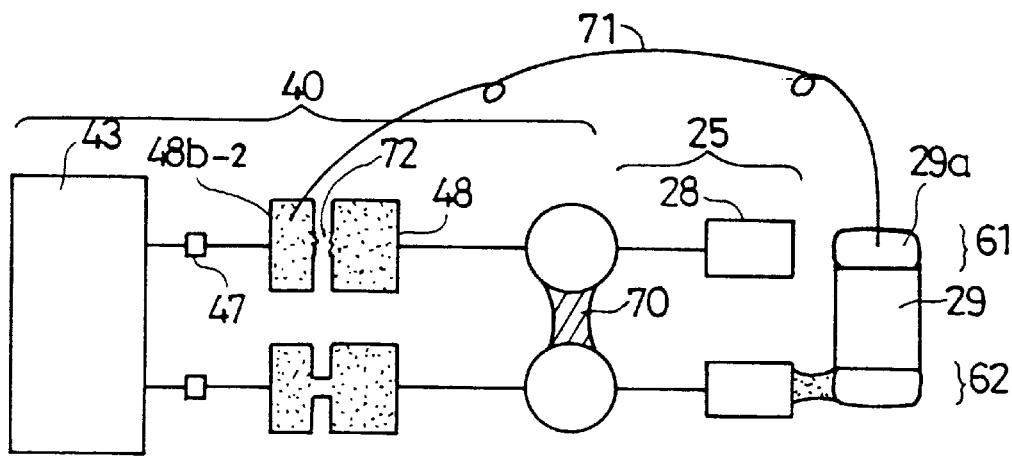

FIGS. 6A and 6B show a repair of a defective soldering of the ball grid array package 40 and the motherboard 25. In FIG. 6A, there is shown a case in which a solder bridge 70 between the adjacent solder balls 45, which is a kind of defective soldering, is produced within the multichip module 30A. In FIG. 6B, there is shown a method of repairing the defective soldering in the case of FIG. 6A.

As shown in FIG. 6B, in order to repair the defective soldering in the case of FIG. 6A, the restricted portion 48b-1 of the half through hole electrode 48 with respect to the route 61 (or the route 62) is cut off by subjecting the restricted portion 48b-1 to a laser beam from a laser beam cutter (not shown). Reference numeral 72 in FIG. 6B indicates the cut-off portion of the half through hole electrode 48. A solder 59 between the chip element 29 and the chip element pad 28 with respect to the route 61 is removed. Further, a jumper wire 71 is soldered at one end to the wire bonding pad 48b-2 of the half through hole electrode 48 with respect to the route 61, and soldered at the other end to a portion 29a of the chip element 29 from which the solder 59 is removed.

In the method of repairing the defective soldering shown in FIG. 6B, although the solder bridge 70, which is the defective soldering, remains in the multichip module 30A, the solder bridge 70 after the repair is performed does not short-circuit the routes 61 and 62. The electrical connection between the semiconductor chip 43 and the chip element 29 via the jumper wire 71 is made after the repair is performed. Therefore, the defective soldering in the case of FIG. 6A can be easily repaired by attaching the jumper wire 71 to the BGA package 40. The solder bridge 70 does not influence the electrical connection between the semiconductor chip 43 and the chip element 29.

Figure 7A:
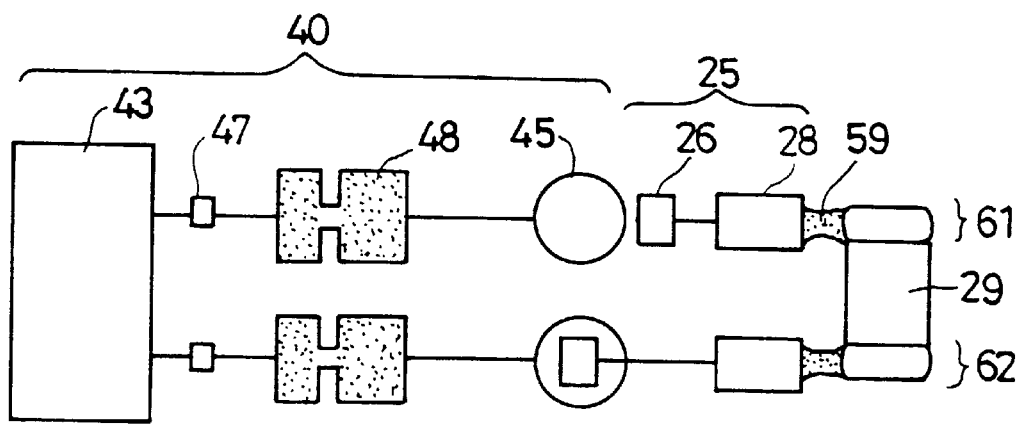
FIGS. 7A and 7B are diagrams for explaining a repair of another defective soldering of the ball grid array package and the motherboard.
Figure 7B:
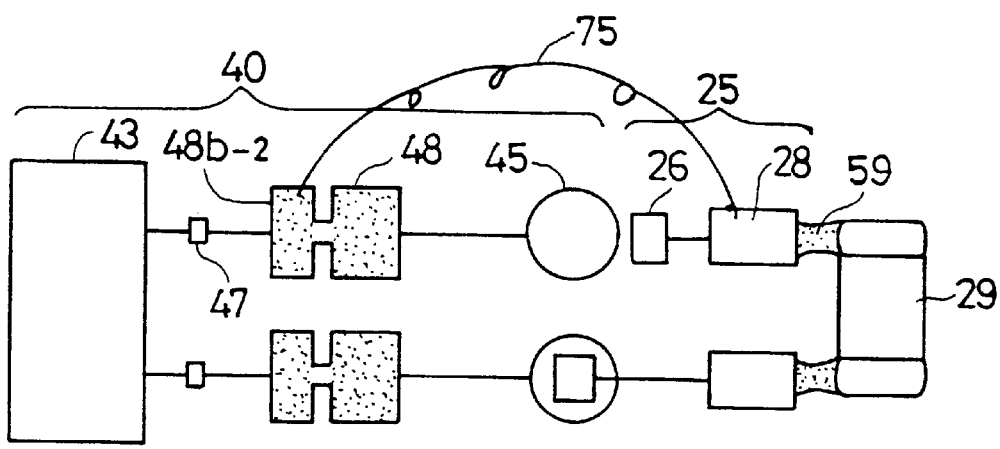

FIGS. 7A and 7B show a repair of another defective soldering of the ball grid array package 40 and the motherboard 25. In FIG. 7A, there is shown a case in which a soldered connection between the solder ball 45 and the pad 26 with respect to the route 61 is incomplete, which is another kind of defective soldering which may be produced in the multichip module 30A. In FIG. 7B, there is shown a method of repairing the defective soldering in the case of FIG. 7A.

As shown in FIG. 7B, in order to repair the defective soldering in the case of FIG. 7A, a jumper wire 75 is soldered at one end to the wire bonding pad 48b-2 of the half through hole electrode 48, and soldered at the other end to the chip element pad 28 of the chip element 29.

In the method of repairing the defective soldering, as shown in FIG. 7B, the electrical connection between the semiconductor chip 43 and the chip element 29 via the jumper wire 75 is established by the repair. The incomplete soldered connection between the solder ball 45 and the pad 26 in the case of FIG. 7A can be easily repaired by attaching the jumper wire 75 to the BGA package 40.

Next, a description will be given of the modification of the electrical characteristics of the multichip module 30A (or the BGA package 40 of the present embodiment).

The modification of the electrical characteristics of the multichip module 30A according to the ball grid array package of the present invention is performed after the BGA package 40 is housed in the motherboard 25.

Figure 8:
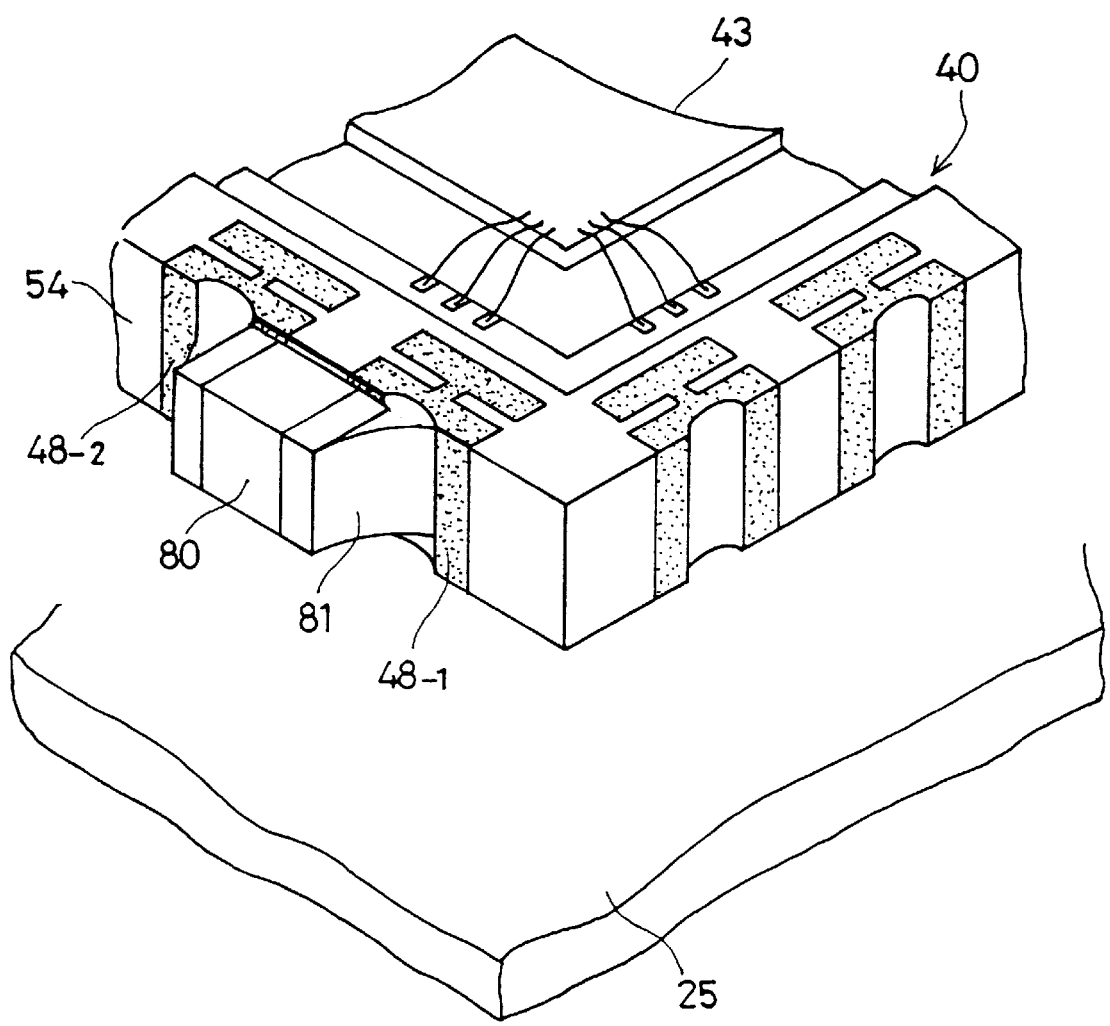
FIG. 8 is a diagram showing an example of a modification of the electrical characteristics of the ball grid array package.

FIG. 8 shows an example of a modification of the electrical characteristics of the BGA package 40 of the present embodiment.

In the example of the modification of FIG. 8, a bypass capacitor 80 is soldered at one end to a half through hole electrode 48-1 and soldered at the other end to a half through hole electrode 48-2. The half through hole electrode 48-1 is connected to a source power pattern of the package board 42 and arranged on the peripheral side surface 54. The half through hole electrode 48-2 is connected to a grounding pattern of the package board 42 and arranged on the peripheral side surface 54. Reference numeral 81 in FIG. 8 indicates the solder between the bypass capacitor 80 and the half through hole electrode 48-1 and the solder between the bypass capacitor 80 and the half through hole electrode 48-2.

The bypass capacitor 80 in the example of the modification of FIG. 8 may be another circuit element that can be used for the purpose of the modification of the electrical characteristics of the multichip module 30A (or the BGA package 40).

In the example of the modification of FIG. 8, the bypass capacitor 80 is additionally attached to the peripheral side surface 54 of the BGA package 40, and the electrical characteristics of the BGA package 40 can be easily modified by attaching the bypass capacitor 80 to the BGA package 40.

Figure 9:
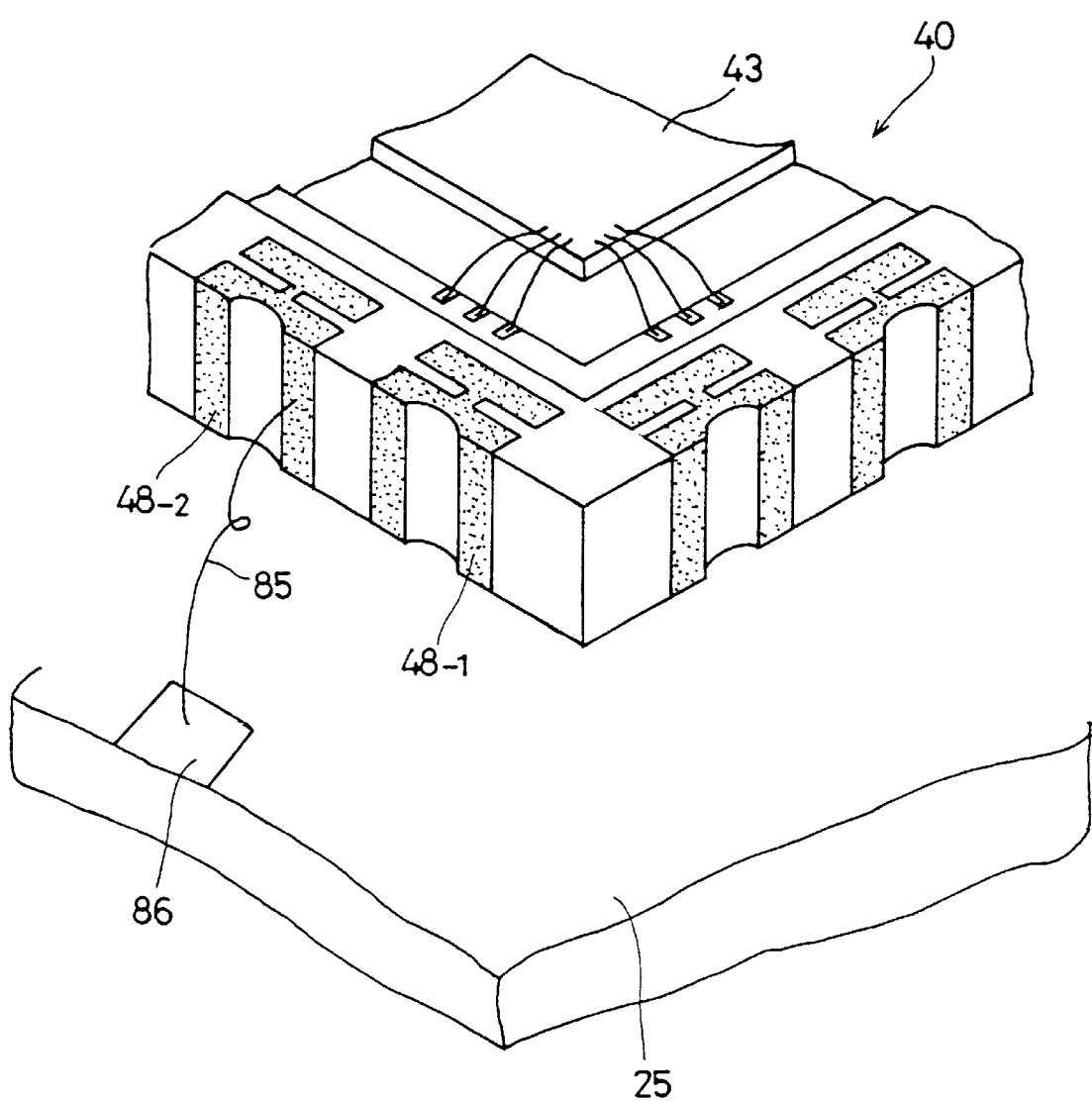
FIG. 9 is a diagram showing another example of the modification of the electrical characteristics of the ball grid array package.

FIG. 9 shows another example of the modification of the electrical characteristics of the BGA package 40 of the present embodiment.

In the example of the modification of FIG. 9, a jumper wire 85 is soldered at one end to the half through hole electrode 48-2 of the BGA package 40 and soldered at the other end to a grounding pattern 86 of the motherboard 25.

The jumper wire 85 is additionally attached to the BGA package 40, and the electrical characteristics of the BGA package 40 can be easily modified by attaching the jumper wire 85 to the BGA package 40. That is, a grounding potential for the BGA package 40 is enhanced by the connection between the half through hole electrode 48-2 and the grounding pattern 86 via the jumper wire 85.

The modification of the electrical characteristics of the BGA package 40 of the present is embodiment is very useful when a development of a new product for a short-term schedule is required.

In the above-described embodiment of the ball grid array package of the present invention, as shown in FIG. 2B, the half through hole electrodes 48 are arranged on the peripheral side surfaces 54 of the package board 42. The number of the half through hole electrodes 48 contained in the BGA package 40 is smaller than the number of the solder balls 45 (or the solder ball pads 46).

In the case of the BGA package 40 of the above-described embodiment, the defective soldering of the BGA package 40 and the motherboard 25 is likely to take place at the corner portions thereof, such as the corner portion 41 shown in FIG. 2A. When the BGA package 40, temporarily bonded to the motherboard 25, is passed through the reflow soldering furnace, the BGA package 40 is slightly deformed due to the heat of the reflow soldering furnace, such that the center portion of the BGA package 40 is made convex. In the BGA package 40 of the above-described embodiment, only the solder balls 45 which are located at the corner portions of the BGA package 40 and in the vicinity of the corner portions thereof are electrically connected to the half through hole electrodes 48.

In a case of a cavity-type BGA package, the center portion of the BGA package is made concave when the BGA package temporarily bonded to the motherboard 25 is passed through the reflow soldering furnace. Also, in the case of the cavity-type BGA package, the defective soldering of the BGA package is likely to take place at the corner portions thereof. Therefore, only the solder balls 45 which are located at the corner portions of the BGA package 40 and in the vicinity of the corner portions thereof are electrically connected to the half through hole electrodes 48.

Figure 10:
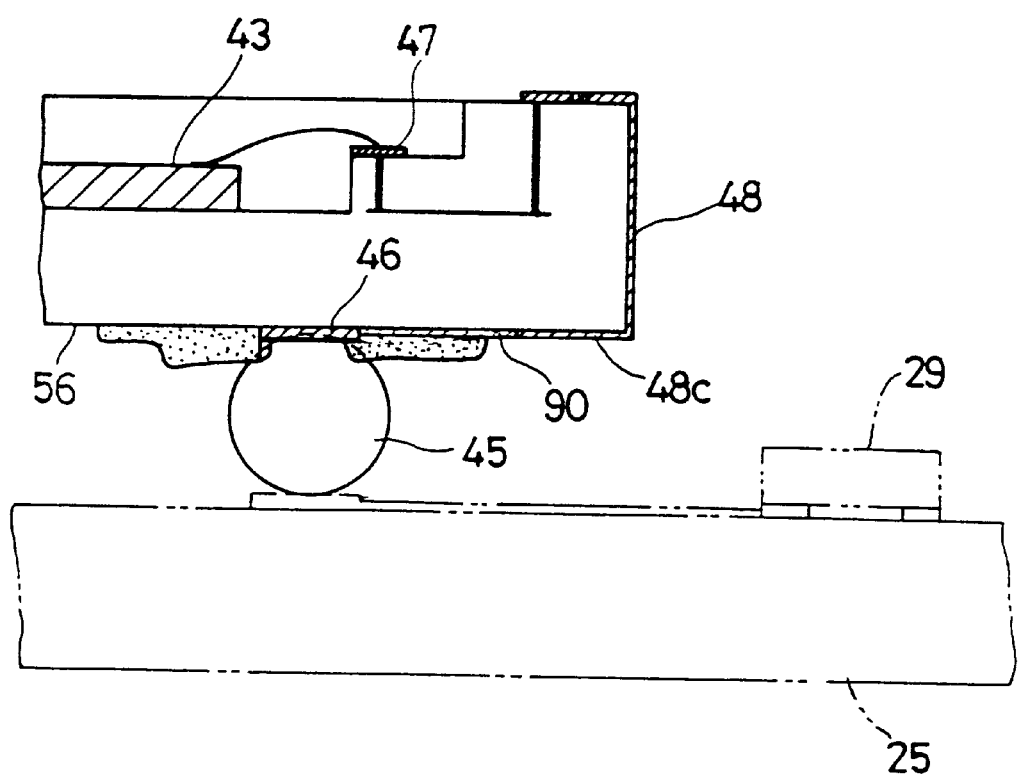
FIG. 10 is a diagram of a second embodiment of the ball grid array package of the present invention.
Figure 11:
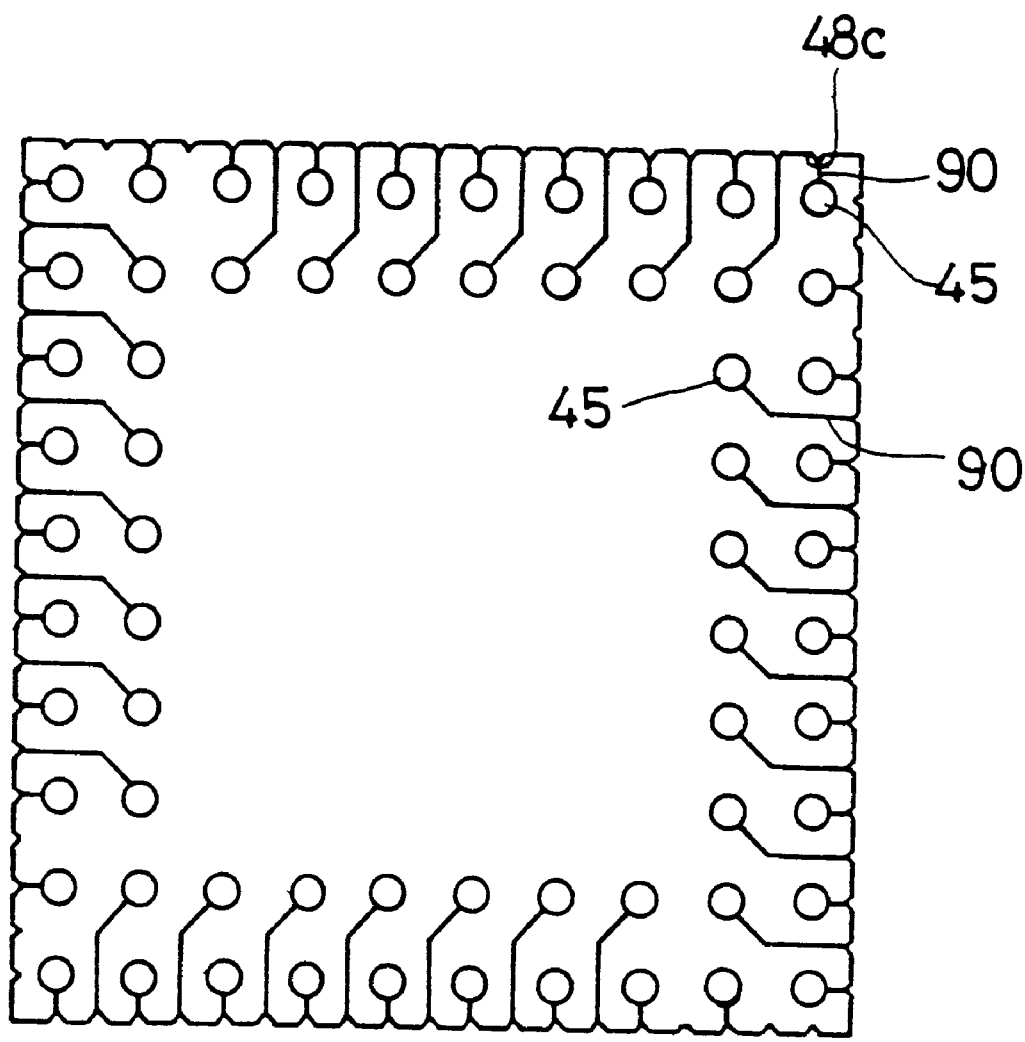
FIG. 11 is a bottom view of the ball grid array package of FIG. 10.

FIG. 10 shows a second embodiment of the ball grid array package of the present invention. FIG. 11 is a bottom view of the ball grid array package of FIG. 10. In FIGS. 10 and 11, the elements which are the same as corresponding elements in FIGS. 2A through 4 are designated by the same reference numerals, and a description thereof will be omitted.

As shown in FIGS. 10 and 11, a ball grid array (BGA) package 40A comprises the package board 42, the semiconductor chip 43 contained on the package board 42, the solder ball pads 46, the half through hole electrodes 48, and the solder balls 45 arrayed in a grid formation on the bottom surface 56 of the package board 42. Further, the BGA package 40A comprises external wiring patterns 90 on the bottom surface 56 of the package board 42.

In the ball grid array package 40A of FIGS. 10 and 11, one of the solder ball pads 46 and one of the wire bonding pads 47 are electrically connected by the third electrode portion 48c of one of the half through hole electrodes 48 and one of the external wiring patterns 90 on the bottom surface 54. Other features of the ball grid array package 40A of the present embodiment are the same as those of the ball grid array package 40 of the first embodiment.

Figure 12A:
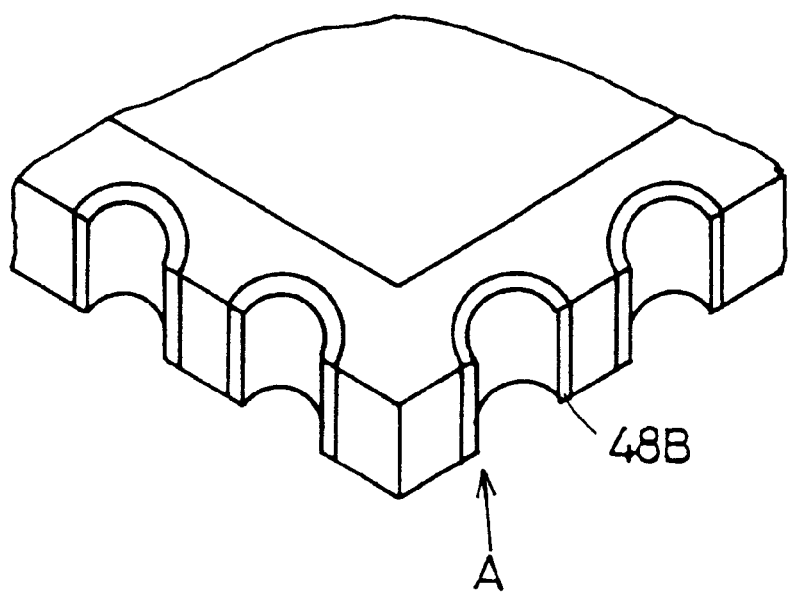
FIGS. 12A and 12B are diagrams showing a corner portion of a third embodiment of the ball grid array package of the present invention.
Figure 12B:
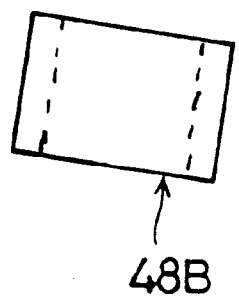
Figure 13:
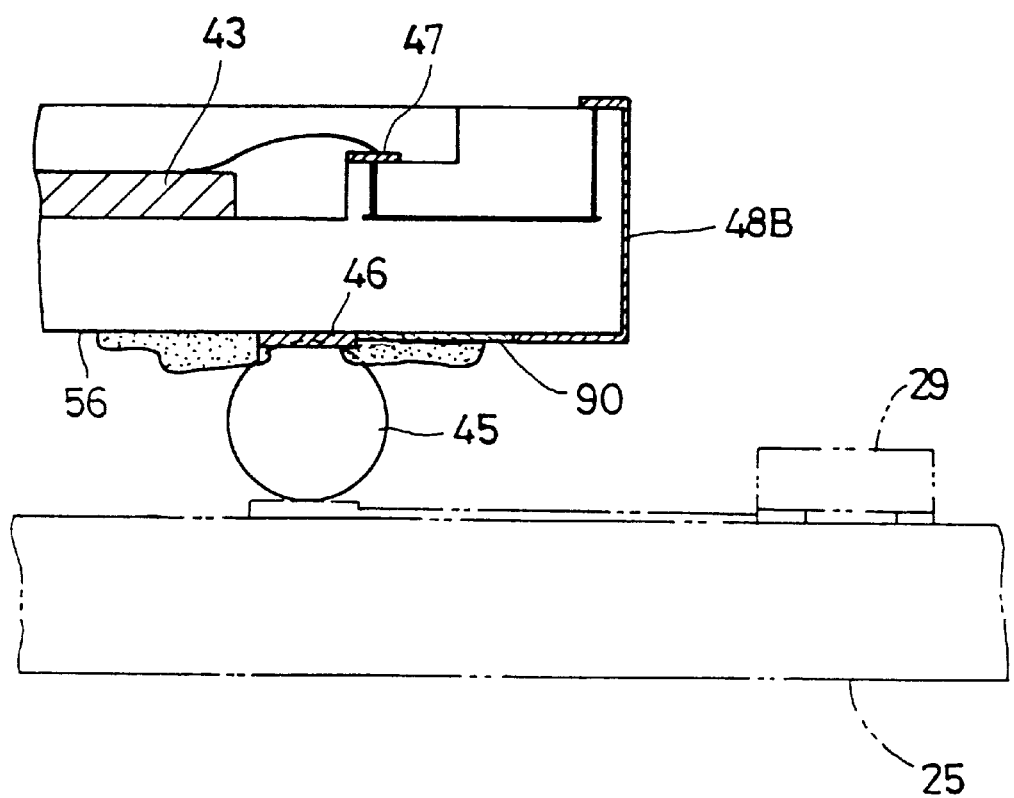
FIG. 13 is a cross-sectional view of the ball grid array package of FIG. 12A.
Figure 14:
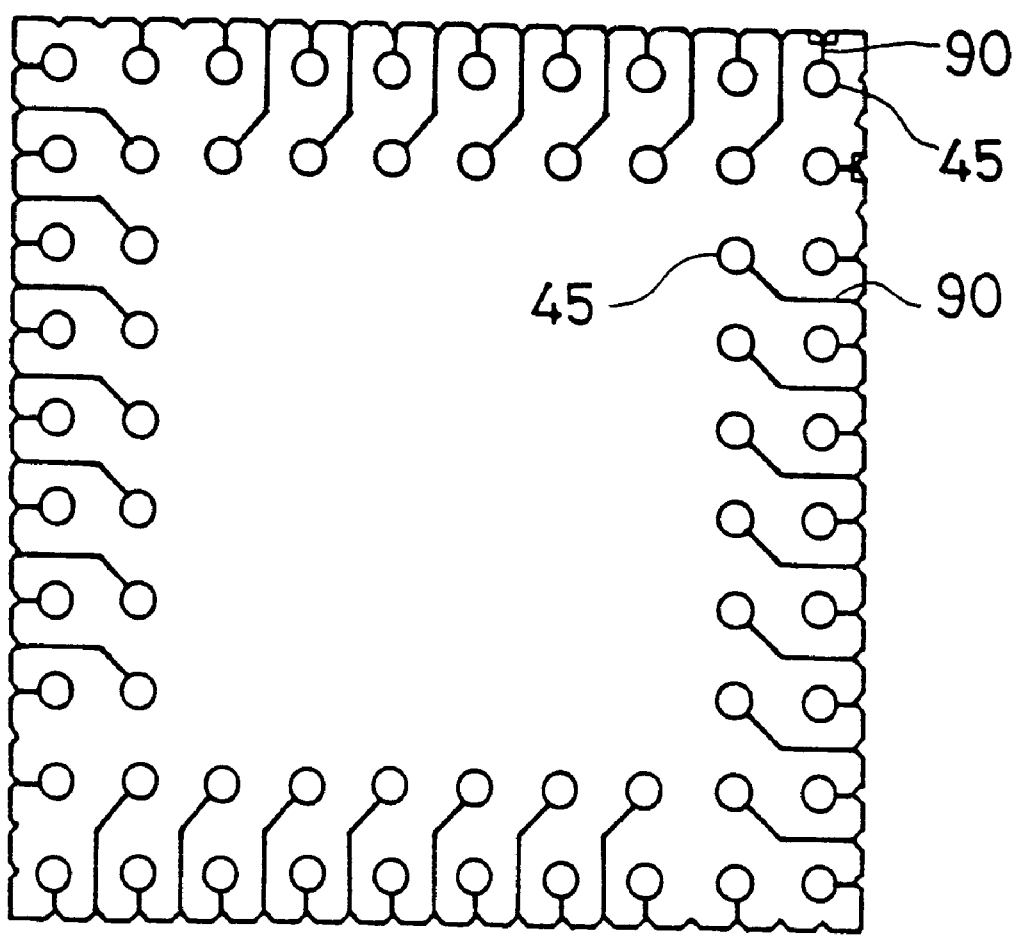
FIG. 14 is a bottom view of the ball grid array package of FIG. 12A.

FIG. 12A shows a corner portion of a third embodiment of the ball grid array package of the present invention, and FIG. 12B shows the details of a half through hole electrode 48B which is indicated by the arrow "A" in FIG. 12A. FIG. 13 is a cross-sectional view of the ball grid array package 40B of FIG. 12A. FIG. 14 is a bottom view of the ball grid array package 40B of FIG. 12A.

In FIGS. 12A through 14, the elements which are the same as corresponding elements in FIGS. 10 and 11 are designated by the same reference numerals, and a description thereof will be omitted.

As shown in FIGS. 12A through 14, the ball grid array package 40B of the present embodiment is constructed in the same manner as the ball grid array package 40A of FIGS. 10 and 11 except for the half through hole electrodes 48B.

The half through hole electrodes 48B of the present embodiment are essentially the same as the half through hole electrodes 48 of FIGS. 3A and 3B except that each of the half through hole electrodes 48B has no restricted portion 48b-1 and no wire bonding pad 48b-2.

Figure 15:
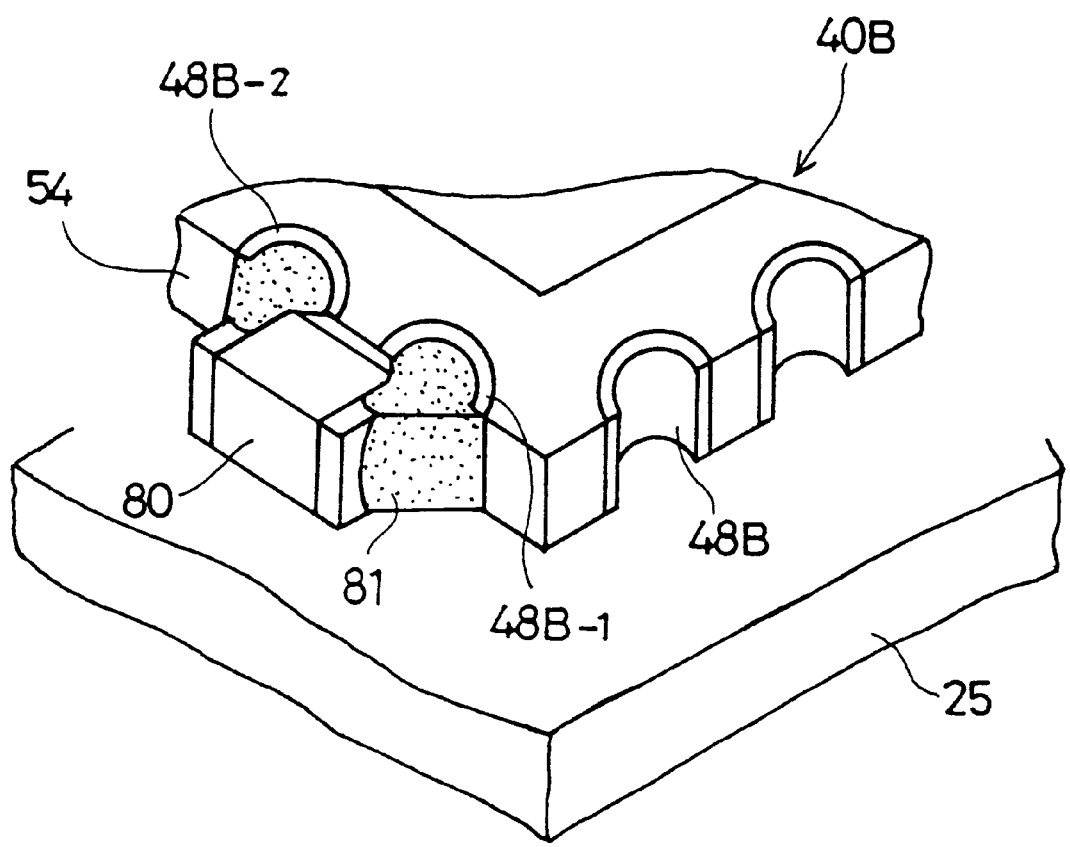
FIG. 15 is a diagram showing an example of a modification of the electrical characteristics of the ball grid array package.

FIG. 15 shows an example of a modification of the electrical characteristics of the ball grid array package 40B of FIG. 12A.

The example of the modification of the electrical characteristics of the ball grid array package 40B of the present embodiment, shown in FIG. 15, is essentially the same as the example of the modification of FIG. 8.

Similarly to the example of the modification of FIG. 8, the bypass capacitor 80 is soldered at one end to the half through hole electrode 48B-1 and soldered at the other end to the half through hole electrode 48B-2. The half through hole electrode 48B-1 is connected to a source power pattern of the package board 42 and arranged on the peripheral side surface 54. The half through hole electrode 48-2 is connected to a grounding pattern of the package board 42 and arranged on the peripheral side surface 54. Reference numeral 81 in FIG. 15 indicates the solder between the bypass capacitor 80 and the half through hole electrode 48B-1 and the solder between the bypass capacitor 80 and the half through hole electrode 48B-2.

In the example of the modification of FIG. 15, the bypass capacitor 80 is additionally attached to the peripheral side surface 54 of the BGA package 40B, and the electrical characteristics of the BGA package 40B can be easily modified by attaching the bypass capacitor 80 to the BGA package 40B.

Figure 16:
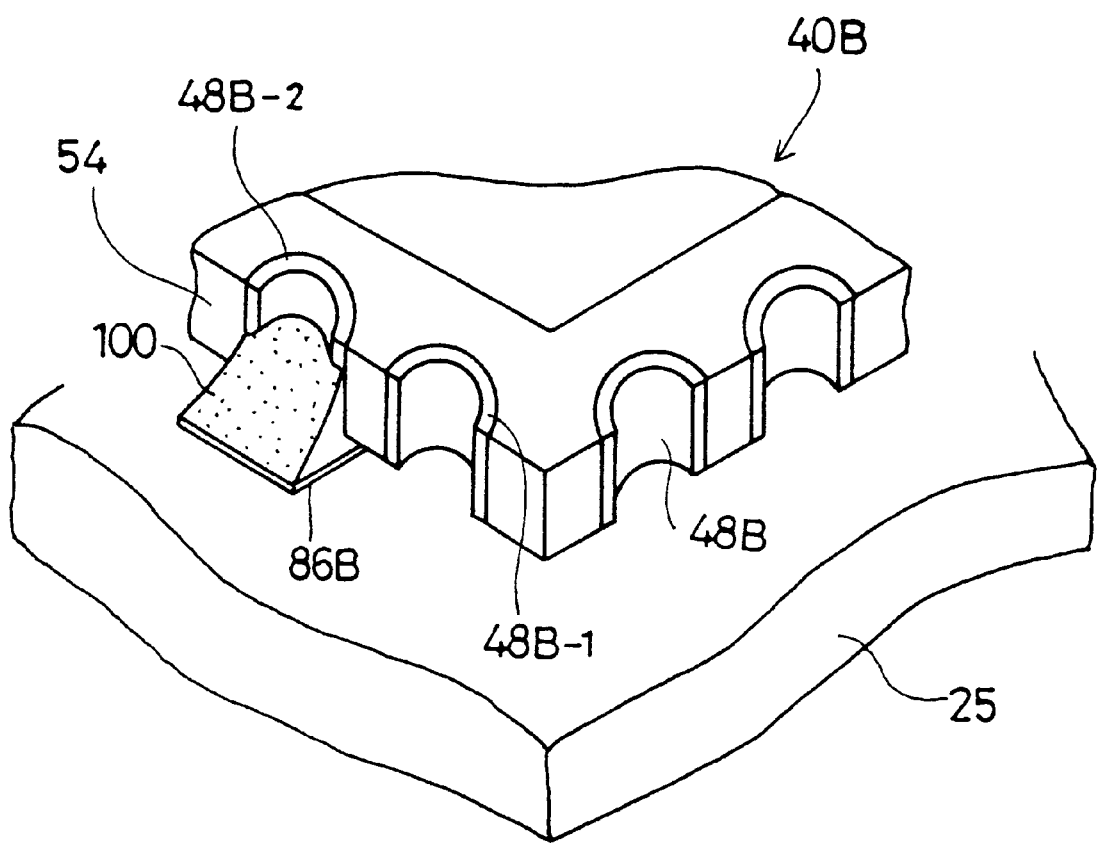
FIG. 16 is a diagram showing another example of the modification of the electrical characteristics of the ball grid array package.

FIG. 16 shows another example of a modification of the electrical characteristics of the ball grid array package 40B of FIG. 12A.

The example of the modification of the electrical characteristics of the ball grid array package 40B of the present embodiment, shown in FIG. 16, is essentially the same as the example of the modification of FIG. 9.

Similarly to the example of the modification of FIG. 9, the half through hole electrode 48B-2 of the BGA package 40B of the present embodiment is soldered to a grounding pattern 86B of the motherboard 25. Reference numeral 100 in FIG. 16 indicates the solder between the half through hole electrode 48B-2 and the grounding pattern 86B. The solder 100 is additionally attached to the BGA package 40B, and the electrical characteristics of the BGA package 40B can be easily modified by attaching the solder 100 to the BGA package 40B. That is, a grounding potential for the BGA package 40B is enhanced by the connection between the half through hole electrode 48B-2 and the grounding pattern 86B via the solder 100.

Further, the present invention is not limited to the above-described embodiments, and variations and modifications may be made without departing from the scope of the present invention.

What is claimed is:

1. A ball grid array package comprising:
   a package board having a bottom surface, a top surface, and peripheral side surfaces, said bottom surface having solder ball pads provided thereon, said top surface having wire bonding pads provided thereon;
   a semiconductor chip contained on the package board, said semiconductor chip being electrically connected to the wire bonding pads of the package board;
   solder balls arrayed in a grid formation on the bottom surface of the package board, said solder balls being respectively soldered to the solder ball pads of the package board;
   electrodes provided on the peripheral side surfaces of the package board, each electrode having a first portion provided on one of the peripheral side surfaces, a second portion provided on the top surface and a third portion provided on the bottom surface; and
   wiring patterns provided between the bottom surface and the top surface of the package board, said wiring patterns electrically connecting the wire bonding pads with the second portions of the electrodes and electrically connecting the solder ball pads with the third portions of the electrodes,
   wherein the semiconductor chip is electrically connected to the solder ball pads through said electrodes and said wiring patterns.

2. The ball grid array package according to claim 1, wherein each of the second portions of the electrodes comprises a restricted portion in the middle of the second portion and a wire bonding pad extending from the restricted portion to a leading edge of the second portion.

3. The ball grid array package according to claim 1, wherein each of the peripheral side surfaces of the package board comprises half through holes provided thereon and separated from each other by a given pitch along the peripheral side surface, and said electrodes are half through hole electrodes provided on the half through holes of each of the peripheral side surfaces of the package board.

4. A multichip module in which the ball grid array package according to claim 1 is contained on a motherboard and a semiconductor chip element is contained on the motherboard, wherein a circuit element is soldered to each of two adjacent ones of the electrodes of the ball grid array package.

5. A multichip module in which the ball grid array package according to claim 1 is contained on a motherboard and a semiconductor chip element is contained on the motherboard, wherein the electrodes of the ball grid array package are electrically connected to pads of the motherboard respectively.

6. A multichip module in which the ball grid array package according to claim 1 is contained on a motherboard and a semiconductor chip element is contained on the motherboard, wherein one of the first portions of the electrodes of the ball grid array package is electrically connected to a grounding pattern of the motherboard.

7. A multichip module in which the ball grid array package according to claim 1 is contained on a motherboard and a semiconductor chip element is contained on the motherboard, wherein each of the second portions of the electrodes comprises a restricted portion in the middle of the second portion and a wire bonding pad extending from the restricted portion to a leading edge of the second portion.

8. The multichip module according to claim 7, wherein the wire bonding pad of the second portion of one of the electrodes is electrically connected to one of chip element pads of the motherboard when a soldered connection between the solder ball for said one of the electrodes and a corresponding one of pads of the motherboard is incomplete.

9. A multichip module in which the ball grid array package according to claim 1 is contained on a motherboard and a semiconductor chip element is contained on the motherboard, wherein the electrodes of the ball grid array package are located adjacent to the semiconductor chip element.

10. The ball grid array package of claim 1, wherein for each electrode, said first portion connects said second and third portions along the corresponding one of the peripheral side surfaces.

11. A package board for use in a ball grid array package which comprises:

the package board having a bottom surface, a top surface, and peripheral side surfaces, said bottom surface having solder ball pads provided thereon, said top surface having wire bonding pads provided thereon;

a semiconductor chip contained on the package board, said semiconductor chip being electrically connected to the wire bonding pads of the package board;

solder balls arrayed in a grid formation on the bottom surface of the package board, said solder balls being respectively soldered to the solder ball pads of the package board;

electrodes provided on the peripheral side surfaces of the package board, each electrode having a first portion provided on one of the peripheral side surfaces, a second portion provided on the top surface and a third portion provided on the bottom surface; and wiring patterns provided between the bottom surface and the top surface of the package board, said wiring patterns electrically connecting the wire bonding pads with the second portions of the electrodes and electrically connecting the solder ball pads with the third portions of the electrodes, wherein the semiconductor chip is electrically connected to the solder ball pads through said electrodes and said wiring patterns.

12. The package board of claim 11, wherein for each electrode, said first portion connects said second and third portions along the corresponding one of the peripheral side surfaces.

* * * * *